US005602479A

United States Patent [19]
Srinivasan et al.

[11] Patent Number: 5,602,479
[45] Date of Patent: Feb. 11, 1997

[54] QUADRATURE RADIO FREQUENCY COIL FOR MAGNETIC RESONANCE IMAGING

[75] Inventors: Ravi Srinivasan, Richmond Hts.; Haiying Liu, Euclid; Robert A. Elek, Chardon, all of Ohio

[73] Assignee: Picker International, Inc., Highland Heights, Ohio

[21] Appl. No.: 512,388

[22] Filed: Aug. 8, 1995

[51] Int. Cl.$^6$ .................................................. G01R 33/20
[52] U.S. Cl. .................... 324/318; 324/322; 128/653.5
[58] Field of Search ................................. 324/318, 322, 324/300, 314, 312, 316; 128/653.5

[56] References Cited

U.S. PATENT DOCUMENTS

| | | | |
|---|---|---|---|
| 4,692,705 | 9/1987 | Hayes | 324/318 |
| 4,769,605 | 9/1988 | Fox | 324/322 |
| 4,887,039 | 12/1989 | Roemer et al. | 324/318 |
| 4,987,370 | 1/1991 | Leussler et al. | 324/318 |
| 5,030,915 | 7/1991 | Boskamp et al. | 324/318 |
| 5,212,450 | 5/1993 | Murphy-Boesch et al. | 324/322 |
| 5,235,277 | 8/1993 | Wichern | 324/318 |
| 5,256,971 | 10/1993 | Boskamp | 324/318 |
| 5,258,717 | 11/1993 | Misic et al. | 324/318 |
| 5,315,251 | 5/1994 | Derby | 324/322 |
| 5,347,220 | 9/1994 | Van Heelsbergen | 324/318 |
| 5,515,855 | 5/1996 | Meyer et al. | 324/318 |

OTHER PUBLICATIONS

"A Novel, High B$_1$ Homogeneity Probe and Matching Techniaue: An Aid to Metabolite Quantitation", Hoult, et al., SMRM 9th Annual Meeting, New York, Book of Abstracts, p. 203 (1990).

"A Hybrid Birdcage Coil Design for Improved Sensitivity and Homogeneity in Head Imaging and Spectroscopy", Meyer, et al., SMRM 12th Annual Meeting, NY Book of Abstracts, p. 1346 (1993).

"A Quadrature 5x5 Mesh Dome Resonator for Head Imaging and Spectroscopy", Meyer, et al., SMR 2nd Annual Meeting, San Francisco, CA, Book of Abstracts p. 217 (1994).

"A 3x3 Mesh Two–Dimensional Ladder Network Resonator For MRI of the Human Head", Meyer, et al., J. Mag. Res. Series B 107, 19–24 (1995).

"A New Quadrature Coil for Neurovascular MR Imaging", Srinivasan, et al., SMR 2nd Annual Meeting, San Francisco, CA, Book of Abstracts, p. 1106 (1994).

"The Spherical Birdcage Resonator", Harpen, J. Mag. Res. 94 550–556 (1991).

"Two Configurations of the Four–Ring Birdcage Coil for $^1$H Imaging and $^1$H–Decoupled $^{31}$P Spectroscopy of the Human Head", Murphy-Boesch, et al., J. Mag. Res. Series B 103, 103–114 (1994).

"A Multiple–Frequency Coil with a Highly Uniform B$_1$ Field", Bolinger, et al. J. Mag. Res 81, 162–166 (1988).

(List continued on next page.)

*Primary Examiner*—Sandra L. O'Shea
*Assistant Examiner*—Raymond Y. Mah
*Attorney, Agent, or Firm*—Fay, Sharpe, Beall, Fagan, Minnich & McKee

[57] ABSTRACT

In a magnetic resonance imaging apparatus, a radio frequency coil (40) is disposed closely adjacent the patient's head. The radio frequency coil includes a first annular ring (80, 114) around the patient's head from which a first plurality of legs (82, 116) extend. Opposite legs are interconnected equidistant from the first annular ring to form a virtual ground connection (84, 118). In the embodiment of FIG. 6, a second annular ring (120) is disposed parallel to the first annular ring with a second plurality of legs (122) extending between the first and second annular rings. By adjusting a ratio ρ of the current flow in the loops defined by the first legs, the first annular ring and virtual ground relative to the current loops defined by the second legs and the first and second annular rings, the linearity of the B$_1$ field within the head coil is selectively adjustable (FIG. 8).

17 Claims, 6 Drawing Sheets

OTHER PUBLICATIONS

"A Volume Optimized Quadrature Elliptical Endcap Birdcage Brain Coil", Wong, et al., SMRM 11th Annual Meeting, Berlin, Book of Abstracts, p. 4015 (1992).

"An Endcap Birdcage Resonator for Quadrature Head Imaging", Hayes, et al., SMRM 5th Annual Meeting, Montreal, Book of Abstracts, Work in Progress, pp. 39–40, 1986.

"Quadrature Detection in the Laboratory Frame", Hoult, et al., Mag. Res. in Medicine 1, 339–353 (1984).

"A Quadrature Coil for the Adult Human Head", Sank, et al., J. Mag. Res. 69 236–242 (1986).

"A Volume Optimized Quadrature Elliptical Endcap Birdcage Brain Coil", Wong, et al., SMRM 11th Annual Meeting, Berlin, Book of Abstracts, p. 4015 1992.

QUADRATURE RADIO FREQUENCY COIL FOR MAGNETIC RESONANCE IMAGING

BACKGROUND OF THE INVENTION

The present invention relates to the magnetic resonance art. It finds particular application in conjunction with magnetic resonance imaging of the head and neck regions of human patients and will be described with particular reference thereto. It is to be appreciated, however, that the invention is also applicable to the examination of other portions of the human anatomy and to the imaging or spectroscopic examination of non-human subjects.

In magnetic resonance imaging, a subject is typically positioned within a strong, temporally constant magnetic field. A series of spatial location encoding magnetic field gradient pulses are applied across a region of interest within the magnetic field. Radio frequency pulses are applied for inducing and manipulating magnetic resonance of dipoles in the region of interest. A radio frequency receiving coil is positioned to receive radio frequency magnetic resonance signals emanating from the region of interest.

Radio frequency receiving coils of various types have been utilized. The radio frequency coils may be disposed to receive signals from the imaging area as a whole or may be positioned closely adjacent the surface of a body portion to be imaged, such as the head. These receiving coils include the "birdcage" type receiving coil. See, for example, Hayes U.S. Pat. No. 4,692,705 issued Sep. 8, 1987. Birdcage coils resonate with cosinusoidal current distribution. Variations on the birdcage coil include end-capped birdcage coils and elliptically end-capped birdcage coils. Other types of receiving coils include coils with cosine distributions, spherical resonators, dome coils, and the like.

The birdcage coil designs have a generally Gaussian distribution of $B_1$ magnetization along the coil axis, with the maximum field strength at the coil center. For head imaging, such a distribution is not ideal. Although the Gaussian distribution can be flattened in the central region, the most commonly imaged region of the human head, the circle of Willis and the surrounding area, are offset from the center of a head coil. Although longer birdcage coils may have a longer area of uniformity, they also have a lower sensitivity. Further, a longer birdcage coil does not allow centering of a short adult's brain at the coil center. A shorter birdcage coil suffers from poorer homogeneity.

End-capped birdcage coils tend to improve the signal-to-noise ratio and homogeneity near the end cap region towards the top of the patient's head. The end-capped birdcage provides a slightly improved signal-to-noise ratio and slightly improved homogeneity towards the closed end. However, the current distribution in the end cap is not alterable. Therefore, the $B_1$ field distribution along coiled axes and close to the end cap remain unchanged. Also, the $B_1$ field computation in the end cap vicinity is complicated by the presence of the continuous cap or shield. The elliptical birdcage is best suited for use with local gradients and for covering the region between the top of the head to the middle of the cerebrum. Multiple birdcage coils mounted end-to-end tend to provide a uniform magnetic field at the coil center with sharp cut-offs toward the coil ends. Although connecting a plurality of birdcage coils provides a uniform field at the coil center with a sharp cut-off adjacent both ends, this is at the expense of the $B_1$ field strength at the coil center. In the multiple birdcage coils, the two outer structures carry a maximum current with only a fraction of their current flowing in the inner structures at the resonant frequency. This causes a reduction in the $B_1$ field at the coil center. This compromises the signal-to-noise ratio for attaining a high degree of $B_1$ uniformity at the coil center.

A two-dimensional ladder type network can improve sensitivity and homogeneity over portions of the brain. See, for example, Derbey U.S. Pat. No. 5,315,251, issued May 24, 1994.

Although two-dimensional networks provide a slightly improved sensitivity and homogeneity relative to a standard birdcage coil over top portions of the brain, the field along the coil axis reduces rapidly when nearing the closed end of the coil. Higher power is needed in the radio frequency excitation or flip pulses along the coil axis. A rapidly reducing radio frequency field or RF gradient is created which is undesirable for imaging smaller vessels where the focus is more towards the top of the brain such as in or above the circle of Willis and in superficial areas of the brain in the case of functional imaging.

The present invention provides a new and improved radio frequency coil which overcomes the above-referenced problems and others.

SUMMARY OF THE INVENTION

In accordance with one aspect of the present invention, a coil structure is provided which has an end ring from which a multiplicity of legs extend. Diagonally opposite legs are connected or shorted together. The points where the diagonally opposite legs are shorted present a point of virtual ground.

In accordance with another aspect of the present invention, a birdcage coil is integrally connected with and shares an end ring with the dome coil.

One advantage of the present invention is that it provides a high signal-to-noise ratio and high homogeneity over the entire brain of an imaged subject.

Another advantage of the present invention is that the coil provides a high signal-to-noise ratio towards the domed end.

Another advantage of the present invention resides in a high degree of $B_1$ homogeneity along the coil axis and close to the dome end.

Another advantage of the present invention is that the coil can be shortened without compromising homogeneity.

Yet another advantage of the present invention is that it provides additional degrees of freedom for optimizing the signal-to-noise ratio and the $B_1$ field profile during coil design.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
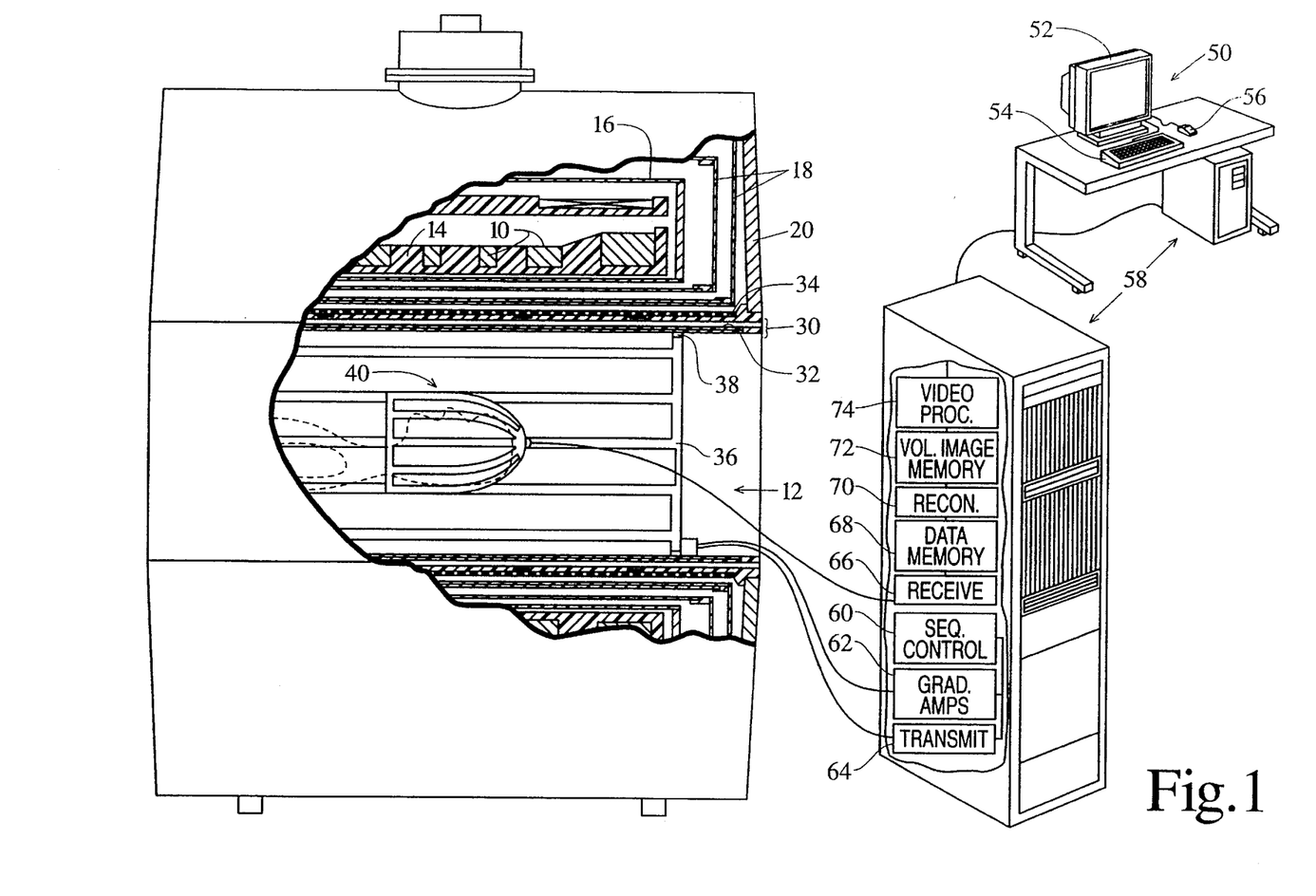
FIG. 1 is a diagrammatic illustration of a magnetic resonance imaging apparatus including a coil in accordance with the present invention.

With reference to FIG. 1, a plurality of primary magnetic coils 10 generate a uniform, temporally constant magnetic field Be along a longitudinal or z-axis of a central bore 12. In a preferred superconducting embodiment, the primary magnet coils are supported by a former 14 and received in a toroidal helium vessel or can 16. The vessel is filled with helium to maintain the primary magnet coils at superconducting temperatures. The can is surrounded by a series of cold shields 18 which are supported in a vacuum dewar 20. Of course, annular resistive magnets, C-magnets, and the like are also contemplated.

A whole body gradient coil assembly 30 includes x, y, and z-coils mounted along the bore 12 for generating gradient magnetic fields, $G_x$, $G_y$, and $G_z$. Preferably, the gradient coil assembly is a self-shielded gradient coil that includes primary x, y, and z-coil assemblies 32 plotted in a dielectric former and secondary x, y, and z-coil assemblies 34 that are supported on a bore defining cylinder of the vacuum dewar 20. A whole body radio frequency coil 36 is mounted inside the gradient coil assembly 30. A whole body radio frequency shield 38, e.g., copper mesh, is mounted between the whole body RF coil 36 and the gradient coil assembly 30.

An insertable radio frequency coil 40 is removably inserted into the bore of an examination region defined about an isocenter of the magnet 10. In the illustrated embodiment, the insertable radio frequency coil is sized to receive a patient's head.

An operator interface and control station 50 includes a human-readable display, such as a video monitor 52, and an operator input means including a keyboard 54, a mouse 56, a trackball, light pen, or the like. A computer control and reconstruction module 58 includes hardware and software for enabling the operator to select among a plurality of preprogrammed magnetic resonance sequences that are stored in a sequence control memory. A sequence controller 60 controls gradient amplifiers 62 connected with the gradient coil assembly 30 for causing the generation of the $G_x$, $G_y$, and $G_z$ gradient magnetic fields at appropriate times during the selected gradient sequence and a digital transmitter 64 which causes a selected one of the whole body and insertable radio frequency coils to generate $B_1$ radio frequency field pulses at times appropriate to the selected sequence.

Resonance signals received by the coil 40 are demodulated by a digital receiver 66 and stored in a data memory 68. The data from the data memory are reconstructed by a reconstruction or array processor 70 into a volumetric image representation that is stored in an image memory 72. A video processor 74 under operator control converts selected portions of the volumetric image representation into slice images, projection images, perspective views, or the like as is conventional in the art for display on the video monitor 52.

Figure 2:
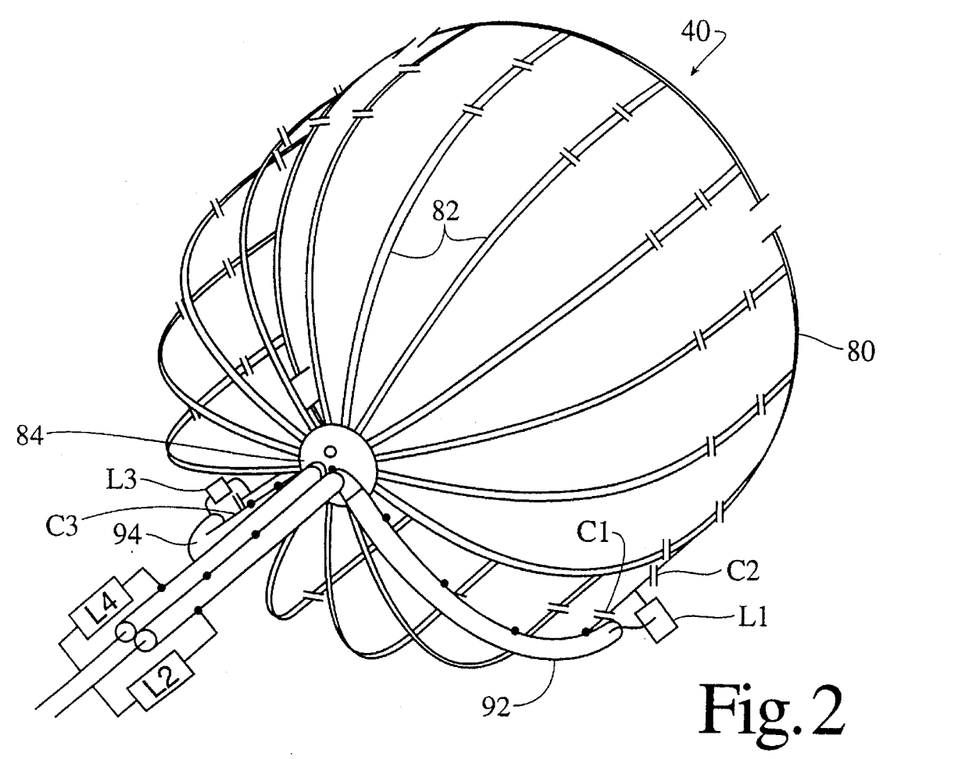
FIG. 2 is a perspective view of a dome coil in accordance with the present invention.

With continuing reference to FIG. 1 and further reference to FIG. 2, the insertable coil 40 is a one-dimensional network. The coil includes an end ring 80 to which a plurality of legs 82 are connected electrically. Although the illustrated embodiment has 16 legs, it is to be appreciated that a larger or smaller number of legs may also be utilized. The diagonally opposite legs are electrically shorted together at a junction point. The pair of opposite legs are symmetric about the junction point, e.g., of equal length with equal capacitive elements. The junction points where each pair of diagonally opposite legs are shorted present a point of virtual ground due to the effect of tapping the end ring at two equal voltage points and 180° out of phase. The entire coil exhibits a frequency mode structure. This frequency mode structure remains the same when the junction points are shorted together. Accordingly, in the preferred embodiment, the junction points of all the legs are merged into a common circular electrode 84 which interconnects the legs at the virtual ground. In the preferred embodiment, a dielectric former, such as a fiberglass dome, defines the shape of the coil 40. The legs 82 and the ring 80 are constructed of thin copper foil which is laminated onto the fiberglass former. In the illustrated embodiment, each leg is interrupted with two capacitors and the end ring is interrupted by at least two capacitors. The capacitors in the end ring are of high capacitive value to reduce any gradient magnetic field induced eddy currents. Alternately, rather than placing the capacitors in the legs, a capacitor can be placed in the end ring between each adjacent pair of legs.

For a coil with N legs, N/2 resonance modes are exhibited (N/2)-1 are degenerate, and 1 is non-degenerate. In the illustrated embodiment for a 1.5 Tesla magnetic field with 16 legs, there are 8 observed modes. The capacitors in the legs are sized such that the modes are preferably 64.75, 98.5, 119.5, 133.5, 142.75, 149.5, 152.75, and 154.0 MHz, respectively, with the 154 MHz mode being the non-degenerate mode.

For an arbitrary n-th one of the N legs, the current distribution for the principal modes follows a cosine current distribution, i.e.:

$$I_n = I_o e^{i(2\pi n/N)} \tag{1}$$

where $I_0$ is the current in the end ring. The direction of the current depends on its azimuthal direction. The first or principal mode has two linear modes, orthogonal to one another. The second order mode also has two modes, but at 45° to one another and behaves as a quadrapole gradient at coil center. The first two linear modes are the ones used in the preferred embodiment to image the patient's brain.

Figure 3:
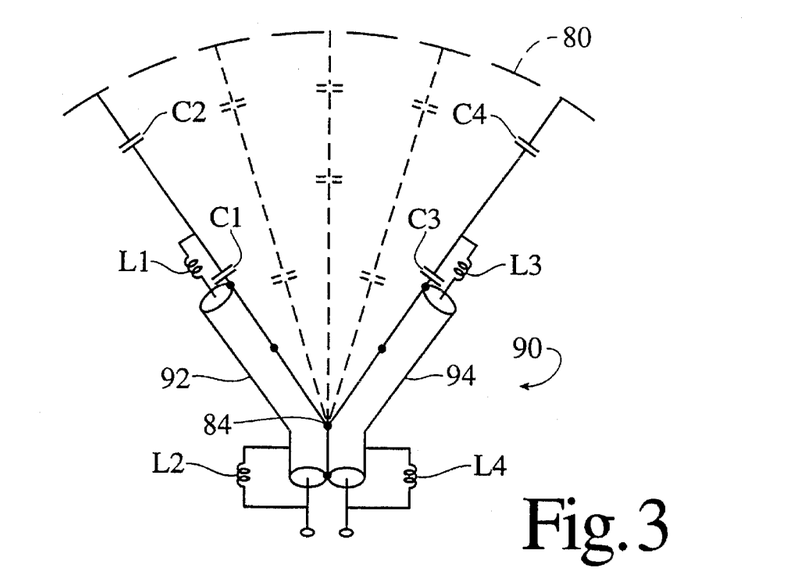
FIG. 3 illustrates an asymmetric feed for connecting a cable with the coil.

With reference to FIG. 3, the coils are electrically coupled to the two orthogonal linear modes of the principal mode using an asymmetric feed 90. The head coil 40 is partially matched with an inductor L1 in series with a semi-rigid coaxial cable 92, across a capacitor C1, and remotely matched to 50 Ohms using another inductor L2. The head coil is matched by an inductor L3 with a second coaxial cable 94 across capacitor C3 and matched to 50 Ohms with an inductor L4. The outer shields of the coaxial cables are electrically connected to portions of the 90° displaced legs between the upper capacitor and the common electrode 84. Exiting the magnetic resonance receiving coil at a common, single virtual ground eliminates the need for balanced matching and use of traps in the ground loops as are commonly used to eliminate cable resonances. In the present design, the coil symmetry and current distribution force the virtual ground point to be in the center of the flat dome end which is convenient for matching the coil to 50 Ohms and to grounding the coil to system ground without the need for cable traps. The two 50 Ohm outputs can be combined in analog prior to preamplification, combined digitally post data acquisition, amplified prior to combination, and the like. For a receive-only coil, this arrangement is advantageous in that individual coupling ports of the coil, where the output is shorted to ground, behave like a trap at the magnetic resonance frequency. First, this presents a high impedance at the individual coupling ports for any circulating RF currents generated during radio frequency transmit. Second, a high impedance is presented to signals from another port of the coil during receive. This second function is also true when additional coils are disposed in association with the dome coil to create an array where the outputs of the coils are connected to individual low impedance preamplifiers.

Figure 4:
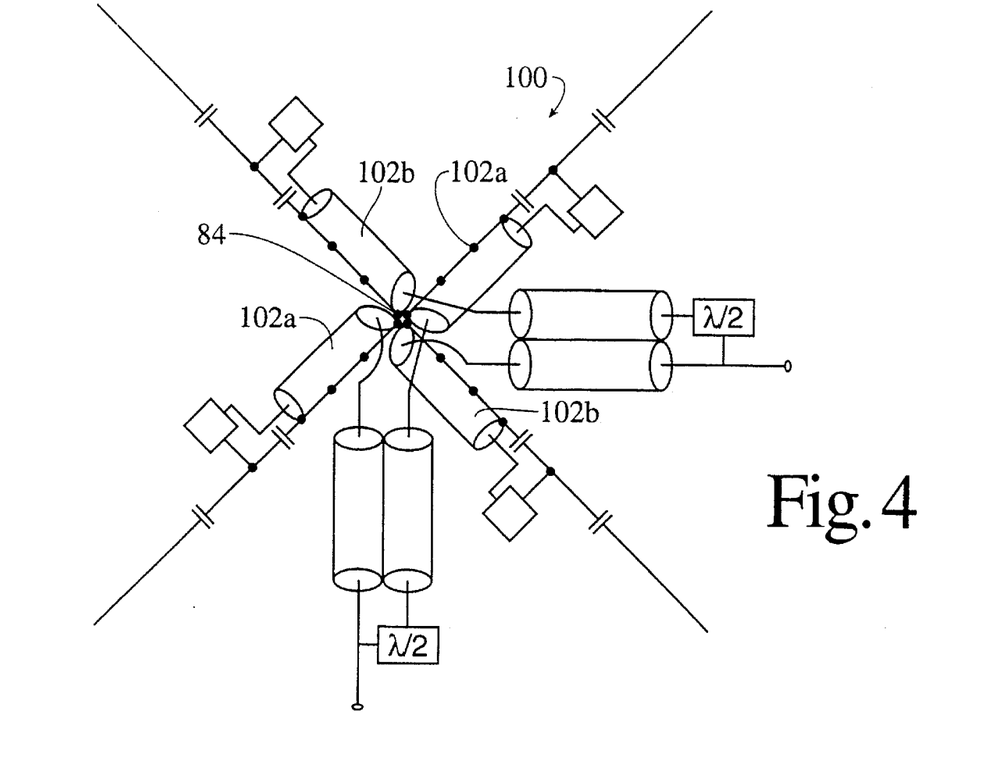
FIG. 4 illustrates a symmetric feed.

With reference to FIG. 4, a symmetric feed 100 can also be used where the individual ports are 90° apart. In the preferred embodiment, the symmetric feed is matched to 100 Ohms and diagonally opposite coupling ports are combined by one of a half wavelength cable and a lumped element network prior to combining in quadrature. A first pair of semi-rigid coaxial cables 102a couple two opposite ports and serve as 50 Ohm lines that exit the coil at the common, virtual ground 84. Analogously, a second pair of semi-rigid coaxial cables 102b couple the 90° displaced pair of opposite ports and exit the cable at the same, common virtual ground point. Exiting the magnetic resonance receiving coil at a common, single virtual ground eliminates the need for balanced matching and use of traps in the ground loops as are commonly used to eliminate cable resonances. In the present design, the coil symmetry and current distribution force the virtual ground point to be in the center of the flat dome end which is convenient for matching the coil to 50 Ohms and to grounding the coil to system ground without the need for cable traps. The two 50 Ohm outputs can be combined in analog prior to preamplification, combined digitally post data acquisition, amplified prior to combination, and the like.

The number of legs, the ratio of the straight parallel portion of the legs relative to the length of the curved portion of the legs relative to the size of the flat domed end are all additional degrees of design freedom that are adjustable to optimize the signal-to-noise ratio and the homogeneity of the coil for a particular application. The coil may be constructed in a low pass, high pass, band pass, or band stop configuration by adjusting the positioning of the capacitors on the coil. The coil ports are matched, preferably to 50 Ohms, by inductive coupling matching, electric coupling matching, including capacitive matching, or the like.

Figure 5:
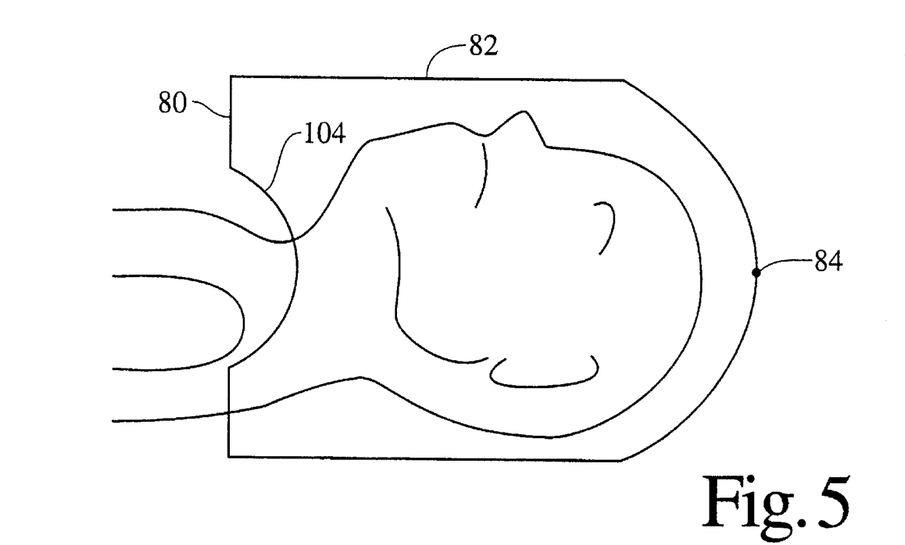
FIG. 5 illustrates an alternate, axially elongated embodiment of the present invention.

With reference to FIG. 5, it is to be appreciated that the dome may be extended axially. However, when used to image a patient's head, the patient's shoulders are a limiting factor in the length of the coil. To accommodate the patient's shoulders, the end ring has a pair of arched sections 104 positioned to accommodate the patient's shoulders. The legs can be positioned relative to the shoulder arches to maintain a four-fold symmetry, a two-fold symmetry, or a no-fold symmetry. Other options include constructing the coil of an elliptical or other non-circular cross-section and may be otherwise contoured or shaped in accordance with a selected body portion to be imaged. Additional capacitors may be used at 45° with respect to the coupling ports on the coil to isolate the two linear principal modes. A remote isolation network may be used alone or in combination with the capacitors. The individual principal modes may be tuned to the same frequency or to different frequencies. One or more of the higher order modes may also be used in imaging. The coil may be used in a receive-only mode, a transmit-only mode, or a transmit-and-receive mode.

Figure 6:
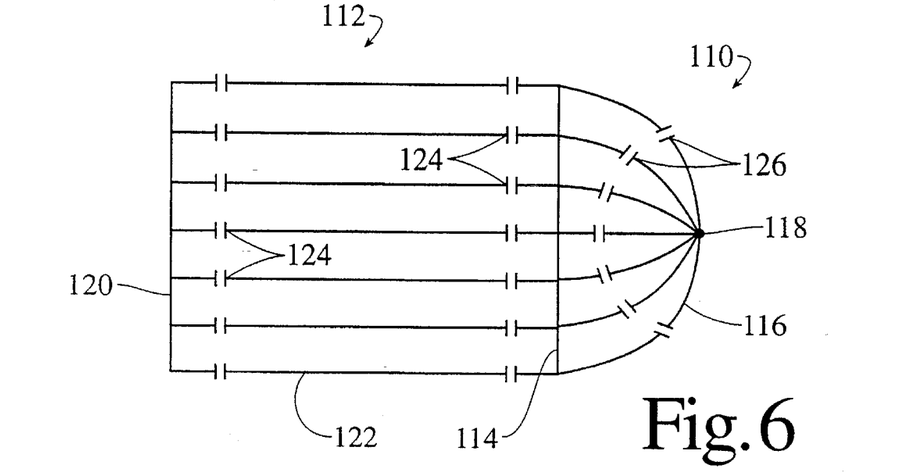
FIG. 6 illustrates a hybrid dome and birdcage coil construction.

With reference to FIG. 6, when a domed coil 110 as described above is combined with a conventional birdcage coil 112, the uniformity of the $B_1$ field is extended dramatically towards to the closed end of the coil without compromising the signal-to-noise ratio at the center of the coil. A first annular ring 114 is common to both the dome coil 110 and the birdcage coil 112. A multiplicity of legs 116, e.g., 16 legs, extend upward from the first ring 114 and converge to a virtual ground interconnection point 118 to one side of the first ring 114. A second ring 120 is disposed on an opposite side of the first ring from the virtual ground 118. A plurality of legs 122, e.g., 16 legs, interconnect the first and second rings. When dimensioning the coil assembly for the human head, a diameter of about 30 cm is preferred, with an overall length of about 26 cm. The two rings are about 20 cm apart, such that the birdcage coil has a length-to-diameter ratio of about 2:3. Capacitors are placed in either the legs or the end rings to operate the coils in high pass or low pass modes or capacitors are placed in rings and legs such that the coils operate in band pass or band stop modes. In the illustrated embodiment, the 16 legs of the birdcage coil are interrupted by a plurality of capacitors 124 and the legs in the dome are interrupted with a plurality of capacitors 126. With 16 legs, 8 modes are observed. More specifically, the capacitors 124, 126, or analogously placed LC networks are sized such that modes are observed at 65.9, 104.9, 129.3, 146.6, 157.6, 164.4, 168.4, and 169.9 megacycles, respectively.

The coil again has N/2 modes, where N is the number of legs, with all but one of the modes being degenerate. As illustrated by the planar schematic of FIG. 7, the virtual ground 118 is at a center point which is four-fold symmetric with respect to the coil. Again, the rings 114, 120 are preferably broken intermittently to reduce gradient induced eddy currents.

Figure 7:
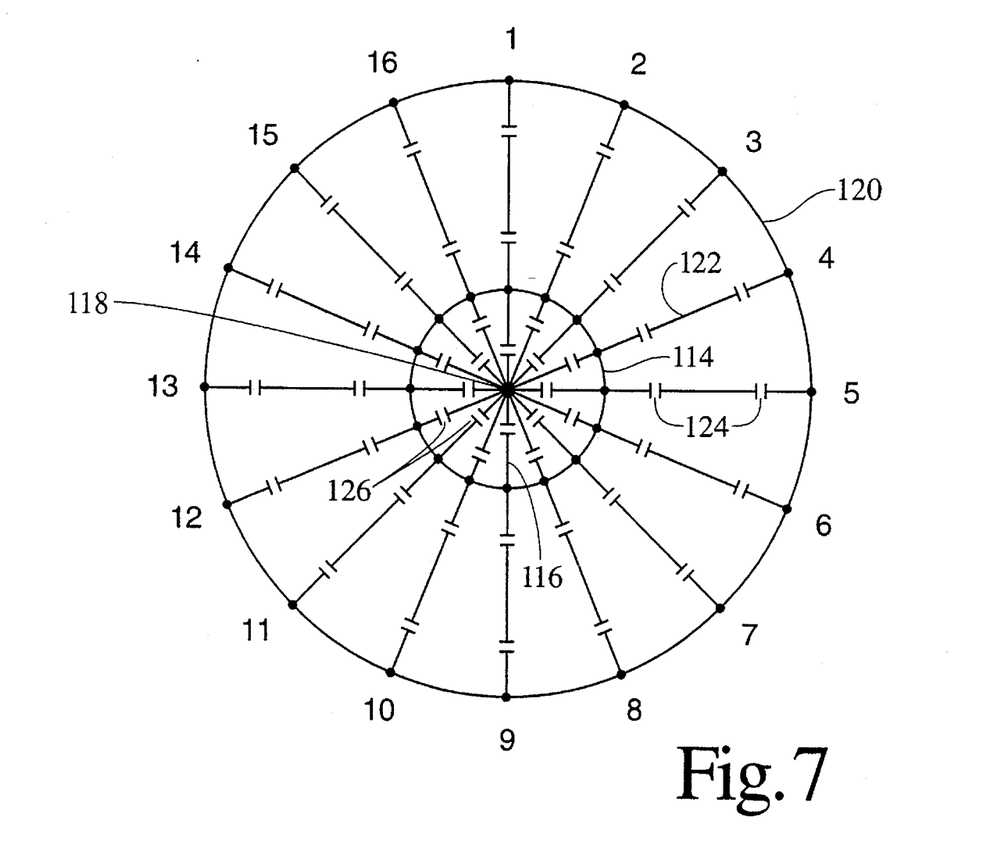
FIG. 7 is a planar electrical schematic of the coil of FIG. 6.

The first or principal mode has two linear modes orthogonal to one another and provide a homogenous field at coil center. The second mode is degenerate and its linear modes are aligned at 45° to one another, and behave as a quadrapole gradient at coil center. In the preferred embodiment, the principal linear modes are used in imaging, although it is to be appreciated that the higher order modes may be used as well. In the preferred embodiment, the principal mode at 65.9 MHz is fine tuned to 63.72 MHz using additional small value capacitors distributed azimuthally across the coil.

All modes exhibit a cosinusoidal current distribution for the $B_1$ field. Individual mesh currents $I_n$ in the birdcage coil between the two rings vary azimuthally following:

$$I_n = I_1 \cos 2\pi k(n-1)/N \qquad (2),$$

where $I_1, I_2, \ldots, I_{N/2}$ are mesh currents bounded by the two rings, n is the mesh number with $n=1,2,\ldots,N/2$, k is the mode number with k=1,2, . . . ,N/2, and N is the total number of legs.

The individual mesh currents $I_m$ in the dome coil bounded by the ring 114 and the virtual ground center point 118 follow the relationship:

$$I_{m=p/n} \quad (3),$$

where $0<\rho<1$, m is the mesh number with m=n=1,2, . . . ,N/2. In this manner, all meshes carry a co-sinusoidal current distribution and vary azimuthally based on physical location.

Figure 8:
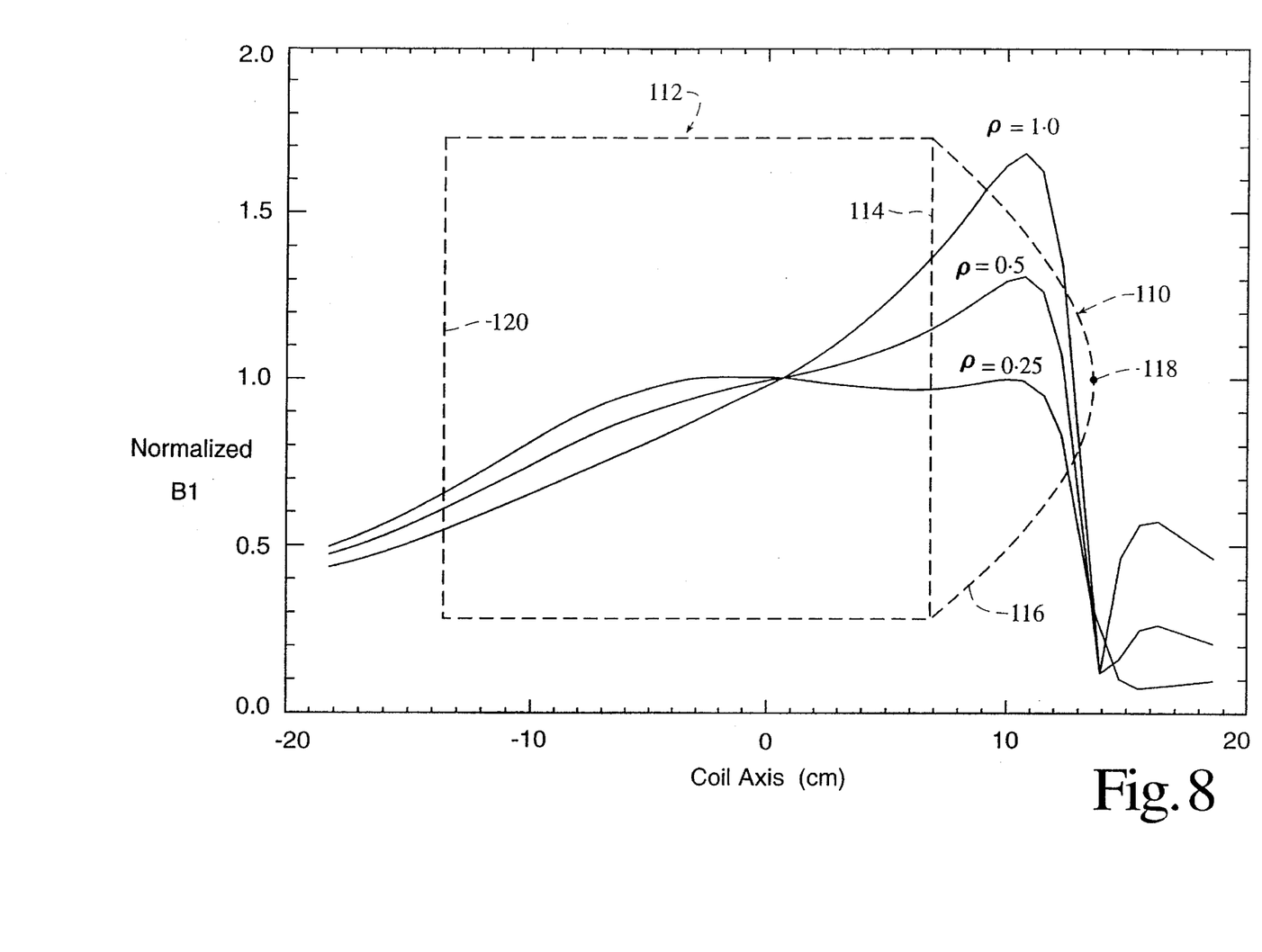
FIG. 8 illustrates variation in the normalized $B_1$ field with changes in relative current flow in the birdcage and dome coils.

With reference to FIG. 8, the uniformity of the $B_1$ field varies with ρ, the ratio of the currents in the birdcage coil and currents in the domed coil. With ρ=0.25, the $B_1$ field is uniform within ±5% along a 16–17 cm long portion of the coil axis. With the illustrated 26 cm long coil, the uniform field is sufficient to cover the entire brain in the sagittal, coronal planes. Although not shown, the current distribution in the two rings and all 16 legs help to provide a uniform field in the axial planes of the coils as well.

The two rings 114, 120 and the legs 122 connecting them contribute almost entirely to the field at coil center with little contribution from the meshes connecting ring 114 with the virtual ground end point 118. However, towards the dome end, the currents from the meshes connected with the virtual ground are in-phase with the mesh currents between the rings. The signals add resulting in an increased signal-to-noise ratio and a highly uniform $B_1$ field along the coil axis, without compromising signal intensity at coil center. The hybrid birdcage/dome coil structure helps to reduce the overall inductance, hence the noise contribution from the coil which helps maintain the high signal-to-noise ratio at coil center.

The hybrid coil of FIG. 6 is coupled with either a two or four-port magnetic (inductive) or electrical (capacitive) coupling, such as discussed above. In the preferred embodiment, the coupling matches the two linear modes of the coil to 50 Ohms.

Rather than a low pass configuration as illustrated in FIG. 6, the coil may be of a low pass, high pass, band pass or band stop configuration or a combination thereof. The shape including coil diameter, coil length, ratio of the straight elements to the dome length, and the number of legs are all designed degrees of freedom which can be varied to optimize the coil for a particular application. An additional degree of freedom in the hybrid design resides in the ability to control the ratio of the currents in the meshes connected with the virtual ground 118 relative to the currents in the meshes of the birdcage coil portion 112 between rings 114, 120. The currents can be adjusted by adjusting the geometry. For a fixed geometry, the current ratio is also adjusted by adjusting the impedance across the legs that extend between the ring 114 and the virtual ground 118. The current ratio can also be adjusted by shifting the ring 114 while retaining the position of rings 120 and the virtual ground 118 constant. Again, as illustrated in FIG. 8, adjusting the current ratio adjusts the $B_1$ field distribution.

Figure 9:
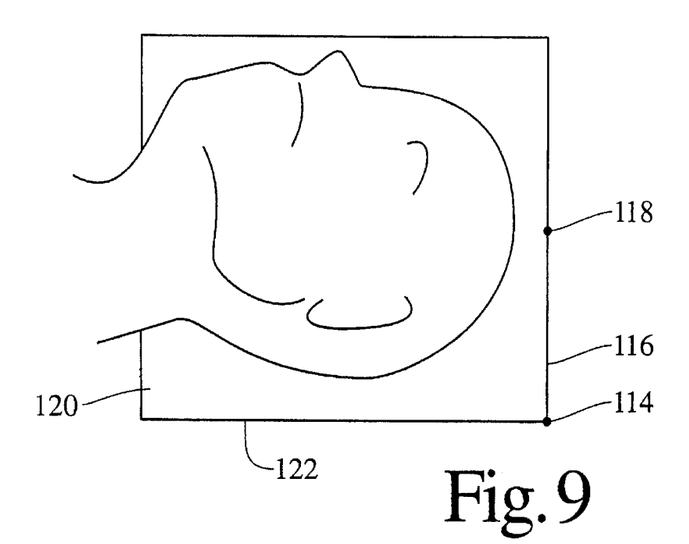
FIG. 9 illustrates an alternate embodiment of the present invention in which the end is flat.
Figure 10:
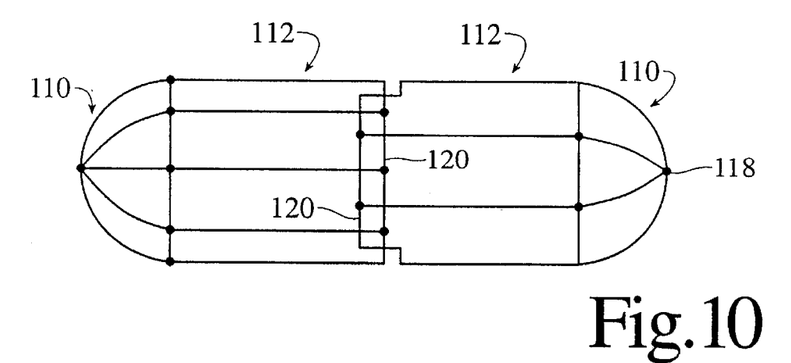
FIG. 10 illustrates another alternate embodiment in which two coils generally of the construction of FIG. 6 are overlapped for minimum mutual inductance; and, FIG. 11 illustrates yet another alternate embodiment in which a coil construction generally as illustrated in FIG. 6 is partially or completely overlapped with surface coils to facilitate head and neck imaging.

Various alternate embodiments are also contemplated. For example, the two rings 114 and 120 may be of the same or a different diameter. In the hybrid coil, the domed end may be of reduced curvature or even flat. Ring 120 can have arched segments analogous to FIG. 5. The coil may be elliptical or have other non-circular shapes in accordance with the anatomy to be investigated. The hybrid coil may be partially or completely overlapped with another volume coil, such as a saddle coil, solenoid, additional birdcage, dome, or the like. As illustrated in FIG. 9, the domed end of the hybrid coil can be shallow or even a flat end. As illustrated in FIG. 10, two sets of hybrid coils as discussed above, but with one having a smaller diameter end ring than the other, are partially overlapped until they reach the point of minimum mutual inductance. These overlapped volume coils can be used in concert for isolated perfused organ studies such as the heart, liver, or kidney, or for cell culture studies.

Figure 11:
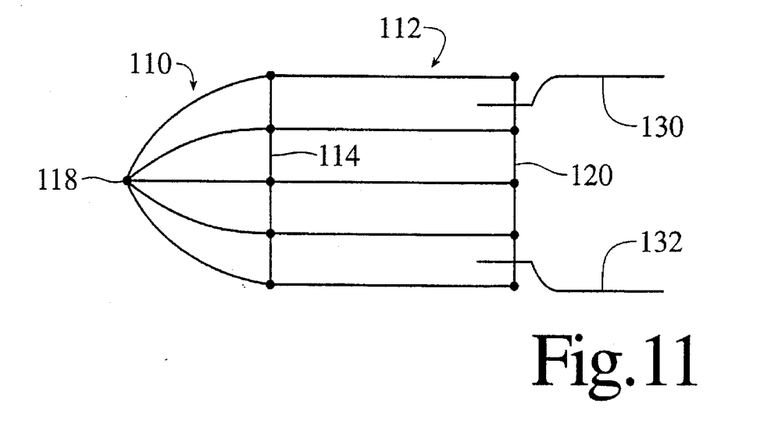

As illustrated in FIG. 11, the hybrid coil can be overlapped with several surface coils in an array configuration such as loop, Helmholtz, or distributed type coils. Head and neck imaging surface coils 130, 132, for imaging the head and neck are particularly advantageous in conjunction with a head volume coil.

Additional capacitors may be placed at 45° intervals with respect to the coupling ports on the coil to tune and isolate two principal linear modes or a remote isolation network may be used. Again, the two outputs may be combined in analog form by a preamplifier mounted at the coil, may be digitized and combined for post data acquisition, may be preamplified at the coil and combined in analog form and further preamplified prior to demodulation and conversion to a digital format in a location remote from the coil. The principal linear modes may be tuned to different frequencies rather than the same frequency. The hybrid coil is amenable to use in the preferred receive-only mode as well as in transmit-only and transmit-and-receive modes. Local gradient coils may be mounted adjacent the above-described radio frequency coils and even combined into an integral package for high resolution or rapid imaging.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance apparatus which includes a magnet for generating a temporally constant uniform magnetic field through an examination region, at least one radio frequency coil which performs at least one of (1) transmitting radio frequency signals into the examination region to induce and manipulate resonance of dipoles disposed in the examination region and (2) receiving radio frequency magnetic resonance signals from the dipoles disposed in the examination region, and a processor for processing the received magnetic resonance signals, the radio frequency coil including:

a first electrically conductive ring;

a second electrically conductive ring disposed generally parallel to the first conductive ring;

a first plurality of legs interconnecting the first and second rings;

a second plurality of legs extending in pairs from the first electrically conductive ring, each pair of legs being connected to 180° opposite points on the first electrically conductive ring, each pair of legs extending from the first electrically conductive ring along arcing paths and being electrically connected to each other symmetrically such that each pair of legs defines an arch with the interconnection at a point of virtual ground;

a plurality of capacitive electrical connections within at least one of (1) the the first and second electrically conductive rings and (2) the legs.

2. In the magnetic resonance apparatus as set forth in claim 1, the radio frequency coil further including:

at least one additional radio frequency coil disposed in a partially or completely overlapping relationship with the second electrically conductive ring.

3. In the magnetic resonance apparatus as set forth in claim 1, the radio frequency coil further including:
   a pair of arched regions in the second electrically conductive ring.

4. In the magnetic resonance apparatus as set forth in claim 1, the radio frequency coil further including:
   the second plurality of legs all extending from the first electrically conductive ring in a like arc and being connected to each other at the virtual ground point to define a dome.

5. In a magnetic resonance apparatus which includes a magnet for generating a temporally constant uniform magnetic field through an examination region, at least one radio frequency coil which performs at least one of (1) transmitting radio frequency signals into the examination region to induce and manipulate resonance of dipoles disposed in the examination region and (2) receiving radio frequency magnetic resonance signals from the dipoles disposed in the examination region, and a processor for processing the received magnetic resonance signals, the radio frequency coil including:
   a conductive ring;
   a plurality of legs extending from the ring with 180° opposite pairs of said legs being electrically connected to each other symmetrically such that the interconnections are at a point of virtual ground;
   a plurality of capacitive electrical connections within at least one of (1) the conductive ring and (2) the legs;
   a first of the legs having a first pair of capacitors;
   a first coaxial lead having an outer conductor connected with the first leg between the capacitors and the virtual ground and a center lead connected by an LC circuit between the first pair of capacitors;
   a second of the legs having a second pair of capacitors; and,
   a second coaxial lead having an outer conductor connected with the second leg between the capacitors and the virtual ground and a center lead connected by an LC circuit between the second pair of capacitors.

6. In the magnetic resonance apparatus as set forth in claim 5, the radio frequency coil further including:
   a second conductive ring disposed generally parallel to the first conductive ring; and,
   a second plurality of legs interconnecting the first and second conductive rings.

7. In the magnetic resonance apparatus as set forth in claim 5, the radio frequency coil further including:
   at least one additional radio frequency coil disposed in an overlapping relationship with the conductive ring.

8. In the magnetic resonance apparatus as set forth in claim 5, the radio frequency coil further including:
   the first and second legs being connected with the conductive ring 90° apart.

9. In a magnetic resonance apparatus which includes a magnet for generating a temporally constant uniform magnetic field through an examination region, at least one radio frequency coil which performs at least one of (1) transmitting radio frequency signals into the examination region to induce and manipulate resonance of dipoles disposed in the examination region and (2) receiving radio frequency magnetic resonance signals from the dipoles disposed in the examination region, and a processor for processing the received magnetic resonance signals, the radio frequency coil including:
   an annular ring;
   first, second, third, and fourth legs extending from 90° spaced points on the annular ring, said legs being electrically connected to each other symmetrically such that the interconnection is at a point of virtual ground;
   the first leg having a pair of capacitors;
   a first coaxial lead having an outer conductor connected with the first leg between the capacitors and the point of virtual ground and a center lead connected by an LC circuit between the pair of capacitors;
   the second leg having a pair of capacitors;
   a second coaxial lead having an outer conductor connected with the second leg between the capacitors and the virtual ground and a center lead connected by an LC circuit between the pair of capacitors;
   the third leg having a pair of capacitors;
   a third coaxial lead having an outer conductor connected with the third leg between the capacitors and the point of virtual ground and a center lead connected by an LC circuit between the pair of capacitors;
   the fourth leg having a pair of capacitors;
   a fourth coaxial lead having an outer conductor connected with the fourth leg between the capacitors and the virtual ground and a center lead connected by an LC circuit between the pair of capacitors;
   a first half-wavelength cable connecting center coaxial conductors of the first and third coaxial leads; and,
   a second half-wavelength conductor connecting center coaxial conductors of the second and fourth coaxial leads.

10. In the magnetic resonance apparatus as set forth in claim 5, the radio frequency coil further including:
    a pair of arched regions in the conductive ring.

11. A radio frequency coil for at least receiving magnetic resonance signals, the radio frequency coil comprising:
    an annular electrically conductive ring;
    a plurality of legs extending from the ring along inward extending paths and meeting at a symmetric mid-point at virtual ground, the mid-point being displaced from a plane of the ring such that the legs define a dome;
    a plurality of capacitive electrical connections within at least one of (1) the annular ring and (2) the legs.

12. The radio frequency coil as set forth in claim 11 further including:
    a second annular electrically conductive ring disposed generally parallel to the first electrically conductive ring; and,
    a plurality of second legs interconnecting the first and second rings.

13. The radio frequency coil as set forth in claim 11, further including:
    an additional coil mounted in association with the annular electrically conductive ring.

14. The radio frequency coil as set forth in claim 12 further including:
    an additional coil overlapping the second annular electrically conductive ring.

15. A radio frequency coil for at least receiving magnetic resonance signals, the radio frequency coil comprising:
    an annular electrically conductive ring;
    a plurality of first legs extending from the ring with pairs of legs being electrically connected to each other at a symmetric mid-point such that the interconnections are at a point of virtual ground;

a first of the legs including a first capacitor;

a first coaxial lead having an outer conductor connected with the first leg between the capacitor and the virtual ground and a center conductor connected by an LC circuit with the first leg;

a second of the legs having a second capacitor; and, a second coaxial lead having an outer conductor connected with the second leg between the capacitor and the virtual ground and a center conductor connected by an LC circuit with the second leg.

16. The radio frequency coil as set forth in claim 15, further including at least one additional coil disposed in an overlapping relationship with the electrically conductive ring.

17. In a method of magnetic resonance imaging in which a temporally constant uniform magnetic field is generated through an examination region, radio frequency signals are transmitted into the examination region to induce and manipulate magnetic resonance of dipoles disposed in the examination region, radio frequency magnetic resonance signals are received from the dipoles resonating in the examination region, magnetic field gradients are applied across the examination region, and the received magnetic resonance signals are processed into an image representation, wherein a radio frequency coil which performs at least one of the transmitting and receiving steps includes a first ring from which a first plurality of legs extend with the legs being connected symmetrically at a point which is at virtual ground and a second ring disposed generally parallel to the first ring with a second plurality of legs extending between the first and second rings such that (i) first radio frequency current loops are defined among the first legs, the first ring, and virtual ground and (ii) second radio frequency current loops are defined among the second legs and the first and second rings, the method further including:

adjusting relative magnitudes of the first and second radio frequency current loops until a profile of a radio frequency $B_1$ field within the radio frequency coil is optimized.

* * * * *